United States Patent [19]

Mehta

[11] Patent Number: 4,814,295
[45] Date of Patent: Mar. 21, 1989

[54] MOUNTING OF SEMICONDUCTOR CHIPS ON A PLASTIC SUBSTRATE

[75] Inventor: Mahendra C. Mehta, Palm Beach Gardens, Fla.

[73] Assignee: Northern Telecom Limited, Montreal, Canada

[21] Appl. No.: 935,198

[22] Filed: Nov. 26, 1986

[51] Int. Cl.[4] ............................................... H01L 3/00
[52] U.S. Cl. ................................ 437/209; 29/832; 29/739; 357/80; 361/331
[58] Field of Search .................... 437/209, 220, 215; 174/52 FP; 357/75, 74

[56] References Cited

U.S. PATENT DOCUMENTS

| | | | |
|---|---|---|---|
| 3,436,818 | 4/1969 | Merrin et al. | 174/52 FP |
| 3,488,840 | 12/1963 | Hymes et al. | 437/209 |
| 3,675,089 | 7/1972 | Hantusch et al. | 437/209 |
| 4,088,546 | 5/1978 | Wu et al. | 437/209 |
| 4,423,435 | 12/1983 | Test, II | 437/209 |
| 4,682,270 | 7/1987 | Whitehead et al. | 174/52 FP |

OTHER PUBLICATIONS

Schmieg, "Dip Storage Module with Stacked Chips", IBM Technical Disclosure Bulletin, vol. 23, No. 6, Nov. 1980, p. 2337.

Doo et al, "Semiconductor Chip Cooling Package", IBM Technical Disclosure Bulletin, vol. 20, No. 4, Sep. 1977, pp. 1440–1441.

Liu et al, "Integrated Circuit Chip Package", IBM Technical Disclosure Bulletin, vol. 17, No. 7, Dec. 1974.

*Primary Examiner*—Brian E. Hearn
*Assistant Examiner*—Beverly A. Pawlikowski
*Attorney, Agent, or Firm*—Foley & Lardner, Schwartz, Jeffery, Schwaab, Mack, Blumenthal & Evans

[57] ABSTRACT

A semiconductor chip mounting is provided by molding a substrate of heat resistant synthetic resin, forming contact pads, which may be protrusions or recesses, on a surface of the substrate as it is molded. A circuit pattern extends to the contact pads which have a conductive surface. The chip is directly mounted on the substrate by soldering contact areas on the chip to the contact pads on the substrate, thus avoiding wire bonding.

7 Claims, 2 Drawing Sheets

MOUNTING OF SEMICONDUCTOR CHIPS ON A PLASTIC SUBSTRATE

BACKGROUND OF THE INVENTION

1. Field of the Invention

This invention relates to the mounting of semiconductor chips on a plastic substrate.

2. Related Art

It is conventional to package semiconductor chips (sometimes referred to as dies) by mounting a chip on a base member, with bonded wire connections between contact pads on the chip and contact pads on the base member. The contact pads on the base member are connected to leads, or other contact members, on the base. These in turn are used to mount the package onto a circuit board. Normally, a top member is attached to the base member around a peripherally extendig rim to form an enclosed package.

As the connections between chip and base member are made by wire connections, the contact pads on the chip are at the edges of the chip. This can cause some difficulties, and restrictions, concerning the circuit pattern on the chip.

SUMMARY OF THE INVENTION

The present invention mounts the chip directly onto a molded plastic substrate, which in turn can be mounted on a circuit board. The use of synthetic plastic material which is moldable and can also withstand soldering temperatures enables contact to be made not only at edges of a chip, but at positions elsewhere on the chip, wherever required.

Broadly, the invention comprises a chip mounting comprising a molded synthetic resin base member having top and bottom surfaces, the base member having contact pads on one surface at particular locations, a circuit pattern connected to the contact pads, a chip mounted on the base member with contact areas on the chip connected to the contact pads on the base member. Contact members are provided for mounting the base member on a circuit board. The contact members can be further contact pads on the other surface. Alternatively, leads can be provided. As a further feature, with a transparent base member, transmission of signals by light can occur through the base member. The invention also comprises a method of mounting a chip by molding a substrate with contact pads thereon, and mounting the chip on the substrate.

BRIEF DESCRIPTION OF THE DRAWINGS

The invention will be readily understood by the following description of certain embodiments, by way of example, in conjunction with the accompanying drawings, in which.

DETAILED DESCRIPTION OF THE EMBODIMENTS

Figure 1:
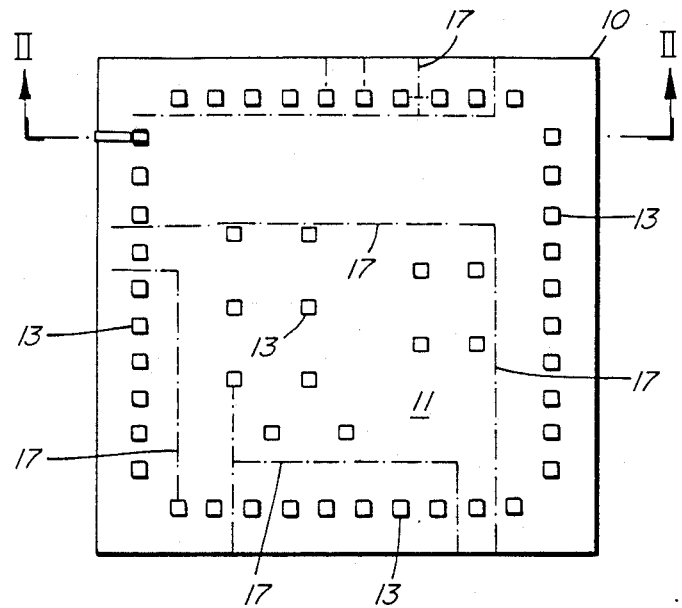
FIG. 1 is a plan view of a plastic base member.
Figure 2:
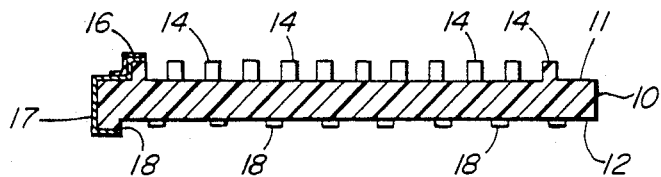
FIG. 2 is a cross-section on the line II—II of FIG. 1, illustrating one form of contact pad.
Figure 3:
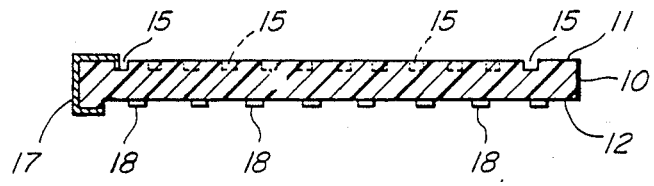
FIG. 3 is a similar cross-section to that of FIG. 2, but illustrating an alternative form of contact pad.

Illustrated in FIG. 1 is a base member 10 for mounting a semiconductor chip, or die. The base member has two spaced parallel surfaces, one surface 11 being shown in FIG. 1. The other surface 12 is shown in FIGS. 2 and 3. On surface 11 there is molded a plurality of contact pads 13. The pads are provided with conductive coatings which connect with a circuit pattern, as will be described in connection with FIGS. 2 and 4. The pads 13, in addition to being positioned adjacent to the periphery of the base member, are also positioned at various positions within the peripheral region.

The contact pads 13 can be in the form of protrusions or recesses, or a combination of both, molded at the time the base member is molded. FIG. 2 is a cross-section through a base member in which a plurality of protrusions 14 are provided. In FIG. 3, a similar cross-section through a base member, a plurality of recesses 15 are provided.

Figure 4:
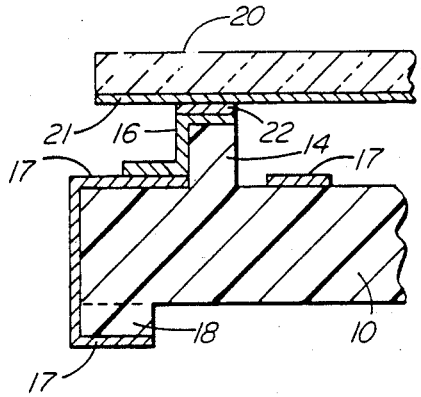
FIG. 4 is an enlarged cross-section of a contact pad as in FIG. 2.
Figure 5:
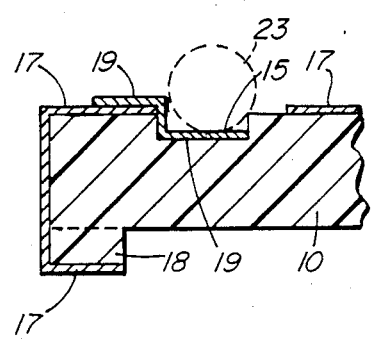
FIG. 5 is an enlarged cross-section of a contact pad as in FIG. 3.

The form of a protrusion 14 is illustrated in more detail in FIG. 4. The protrusion 14 has a conductive layer 16 extending over the end surface and down one side surface. The layer 16 extends to overlap a conductor of a circuit pattern 17. The circuit pattern is continued down an edge surface of the base member and back over a shallow pad or protrusion 18 molded on the surface 12. FIG. 5 illustrates in more detail a recess 15. A conductive layer 19 extends over the bottom surface of the recess, up one side and overlaps circuit pattern 17. The circuit pattern extends down the edge surface and over shallow protrusion 18 as in FIG. 3, and in FIG. 1. The circuit pattern 17 extends to connect various ones of pads 13—protrusions 14 or depressions 15—to various ones of the shallow protrusions 18. The circuit pattern also connects the pads positioned in the center part of surface 11, and is indicated diagrammatically in FIG. 1. Instead of forming conductive layers 16 and 19 separately from the circuit pattern 17, the circuit pattern and conductive layer can be formed at the same time as an integral layer.

In the arrangement as illustrated in FIG. 4, part of chip 20 is shown. The chip has a circuit pattern 21 on one surface and a contact area 22 on the chip is seen in contact with a protrusion 14. The contact area and contact pad are soldered together.

In the arrangement of FIG. 5, soldering of a chip contact area to a pad is readily achieved by positioning a solder preform 23 in each recess. The preform melts and connects the contact area and contact pad on heating.

Figure 6:
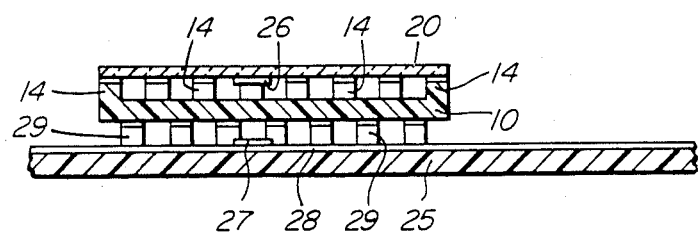
FIG. 6 is a cross-section through part of a circuit board on which is mounted a chip, with a light emitting device on the circuit board cooperatively positioned relative to a light detector on the chip, with a transparent base member.

FIG. 6 illustrates a base member 10 similar to that illustrated in FIGS. 1, 2 and 4, with a semiconductor chip 20 mounted thereon. The base member 10 is mounted on a circuit board 25. The chip 20 is bonded, i.e. soldered, to the conductive layer on the protrusions 14, as illustrated in FIG. 4. Shown on the chip 20 is an optical detector 26. Mounted on the circuit board 25 is an optical emitter 27, the emitter being connected to the circuit pattern 28 on the circuit board. The detector 26 will form part of the circuit pattern on the chip. The base member is of a transparent plastic material and the emitter 27 and detector 26 are coupled through the base member.

Only one component or device, the detector 26, is shown on the chip 20 in FIG. 6. Normally a very large number of components or devices are formed on a chip and only one is shown in FIG. 6 for clarity and as an example. There may be more than one detector and also more than one emitter. It is also possible that an emitter be formed on the chip and coupling with a detector on the circuit board.

In the example of FIG. 6, the circuit board is also molded and has protrusions 29 molded on its surface for mounting of the base member. Alternatively, a conventional fiber reinforced resin circuit board can be provided and protrusions molded on the base member to cooperate with contact areas on the circuit board.

By making it possible to provide contacts at positions other than at the edge of a chip, various advantages occur. A reduction in conductor paths can be obtained, permitting a higher device density. Connection can be made very close to certain components, such as bypass capacitors, which can reduce noise and undesirable emissions.

The chip is bonded to the base member by the application of heat. This can be provided by a heater element molded in the base member, or printed on the base member.

The invention provides a simple, cost effective, mounting of semiconductor chips. Wire bonding is eliminated. Wire bonding is a relatively slow process, even when automated, as two connections or bondings per wire are necessary. With the present invention, all connections can be made at the same time. Also, there is only one connection between a chip contact area and a pad on the circuit pattern. Inspection of the bonding is easy. There is improved temperature match between the mounted chip and the circuit board. Many high lead count packages are now ceramic and temperature mismatch occurs when such a package is mounted on a circuit board. A metallic layer can be incorporated for heat dissipation. Higher densities are possible and a higher frequency and lower time delay operation is possible, with improved noise characteristics.

It is also possible to mold the base members from a relatively thin sheet of material, the protrusions and/or recesses being molded by embossing or otherwise deforming the sheet.

What is claimed is:

1. A method of mounting a semiconductor chip, comprising:
    molding a substrate of heat resistant synthetic resin and forming a plurality of contact pads for each of a pair of surfaces;
    forming a conductive layer on each contact pad on one of said surfaces;
    forming a circuit pattern on said one surface, said circuit pattern extending to said contact pads on said one surface and connecting to said conductive layers;
    positioning a chip on said one surface, contact areas on said chip being in contact with said contact pads on said one surface;
    soldering said contact area on said contact pads on said one surface; and
    forming electrical connections between said contact pads on one surface and said contact pads on the other surface.

2. A method as claimed in claim 1, including molding protrusions on said other surface to form said contact pads on the other surface.

3. A method of claim 1, wherein said substrate is molded of transparent synthetic resin material.

4. A method of mounting a semiconductor chip, comprising:
    molding a substrate of heat resistant synthetic resin with a plurality of contact pads thereon in the form of protrusions on each of a pair of surfaces;
    forming a conductive layer on each contact pad on one of said surfaces;
    forming a circuit pattern on said one surface, said circuit pattern extending to said contact pads on said one surface and connecting to said conductive layers;
    positioning a chip on said one surface, contact areas of said chip being in contact with said contact pads on said one surface; and
    soldering said contact areas on said contact pads of said one surface.

5. A method of claim 4, wherein said substrate is molded of transparent synthetic resin material.

6. A method of mounting a semiconductor chip, comprising:
    molding a substrate of heat resistant synthetic resin and a plurality of contact pads on each surface, the contact pads on one surface being in the form of recesses;
    forming a conductive layer on each contact pad on one of said surfaces;
    forming a circuit pattern on said one surface, said circuit pattern extending to said contact pads on said one surface and connecting to said conductive layers;
    positioning a chip on said one surface, contact areas of said chip being in contact with said contact pads on said one surface; and
    soldering said contact areas on said contact pads of said one surface.

7. A method of claim 6, wherein said substrate is molded of transparent synthetic resin material.

* * * * *